(12) United States Patent
Meguro et al.

(10) Patent No.: US 7,655,208 B2
(45) Date of Patent: Feb. 2, 2010

(54) SINGLE CRYSTALLINE DIAMOND AND PRODUCING METHOD THEREOF

(75) Inventors: Kiichi Meguro, Itami (JP); Yoshiyuki Yamamoto, Itami (JP); Takahiro Imai, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 524 days.

(21) Appl. No.: 11/402,062

(22) Filed: Apr. 12, 2006

(65) Prior Publication Data

US 2006/0231015 A1    Oct. 19, 2006

(30) Foreign Application Priority Data

Apr. 15, 2005 (JP) ............... 2005-117948
Mar. 7, 2006 (JP) ............... 2006-060511

(51) Int. Cl.
- B01J 3/06 (2006.01)
- C01B 31/00 (2006.01)
- C30B 29/04 (2006.01)
- G11B 5/65 (2006.01)

(52) U.S. Cl. ............... 423/446; 423/414; 428/833.2; 428/835; 117/929

(58) Field of Classification Search ............... 117/929; 428/833.2, 835; 423/414.446
See application file for complete search history.

(56) References Cited

U.S. PATENT DOCUMENTS

| | | | |
|---|---|---|---|
| 5,753,038 A | 5/1998 | Vichr et al. | |
| 6,162,412 A * | 12/2000 | Fujimori et al. | 423/446 |
| 6,582,513 B1 * | 6/2003 | Linares et al. | 117/93 |
| 6,858,078 B2 * | 2/2005 | Hemley et al. | 117/68 |
| 6,858,080 B2 * | 2/2005 | Linares et al. | 117/86 |
| 7,172,655 B2 * | 2/2007 | Twitchen et al. | 117/2 |
| 7,390,695 B2 * | 6/2008 | Meguro et al. | 438/105 |
| 7,407,549 B2 * | 8/2008 | Meguro et al. | 117/95 |
| 7,481,879 B2 * | 1/2009 | Meguro et al. | 117/88 |
| 2003/0131787 A1 * | 7/2003 | Linares et al. | 117/93 |
| 2004/0175499 A1 * | 9/2004 | Twitchen et al. | 427/249.8 |
| 2004/0194690 A1 * | 10/2004 | Twitchen et al. | 117/68 |
| 2004/0221795 A1 * | 11/2004 | Scarsbrook et al. | 117/68 |
| 2005/0181131 A1 * | 8/2005 | Linares et al. | 427/249.8 |
| 2006/0185583 A1 * | 8/2006 | Hemley et al. | 117/104 |
| 2007/0036921 A1 * | 2/2007 | Twitchen et al. | 428/15 |
| 2007/0054124 A1 * | 3/2007 | Gill et al. | 428/408 |
| 2007/0079752 A1 * | 4/2007 | Twitchen et al. | 117/89 |

FOREIGN PATENT DOCUMENTS

| | | |
|---|---|---|
| EP | 1 555 337 A2 | 7/2005 |
| EP | 1 591 565 A1 | 11/2005 |
| JP | 63-224225 | 9/1988 |
| JP | 2-233591 | 9/1990 |
| JP | 3-75298 | 3/1991 |
| JP | 4-132687 | 5/1992 |
| JP | 2003-277183 | 10/2003 |
| WO | WO 2004/046427 A1 | 6/2004 |
| WO | WO 2005/012894 A1 | 2/2005 |

OTHER PUBLICATIONS

European Search Report issued in corresponding European Patent Application No. 06 25 1968, dated Sep. 15, 2006.
English translation of Chinese Office Action issued in Chinese Patent Application No. CN 2006100737901 dated Aug. 1, 2008.
E.E. Wahlstrom, "Optical Crystallography," 4th Edition, pp. 141-144, 462-465, 1943.
S. A. Solin & A. K. Ramdas, "Raman Spectrum of Diamond," Physical Review B, vol. 1, No. 4, Feb. 15, 1970, pp. 1687-1698.
European Notice of Opposition issued in European Patent Application No. EP 06 25 1968.1 dated Sep. 17, 2009.

* cited by examiner

*Primary Examiner*—Robert M Kunemund
*Assistant Examiner*—G. Nagesh Rao
(74) *Attorney, Agent, or Firm*—McDermott Will & Emery LLP

(57) ABSTRACT

The object of the present invention is to obtain a high quality single crystalline diamond that has less distortion and large area suitable for semiconductor device substrates or an optical component material. The present invention is a single crystalline diamond produced by chemical vapor deposition, wherein, when a linear polarized light which is composed of two linear polarized lights perpendicular to each other is introduced into one main face of the single crystalline diamond, a maximum value of a retardation between the two linear polarized lights perpendicular to each other which come out from an opposite main face is not more than 50 μm at maximum per a thickness of 100 μm across an entire of the single crystalline diamond, and also a method for producing the diamond.

8 Claims, No Drawings

SINGLE CRYSTALLINE DIAMOND AND PRODUCING METHOD THEREOF

TECHNICAL FIELD

The present invention provides a diamond, especially a large scaled single crystalline diamond suitable for semiconductor device substrates or optical components, and a producing method thereof.

BACKGROUND ART

Since diamond has many excellent characteristics such as high hardness, high thermal conductivity, high light transmittance and wide band gap, it has been widely utilized as a material for some kinds of tools, optical components, semiconductors and electronic devices and importance of diamond is expected to increase in the future. Diamond which was naturally produced served industrial use in the past but now architecturally synthesized diamond is supplied for most of industrial use. Single crystalline diamond is synthesized under high pressure over tens of thousands of atmospheric pressure in the current industry. Extremely high pressure vessels that provide such high pressure are very expensive and their size has to be limited, then single crystal synthesis of a larger scaled single crystal by high temperature-high pressure method is restricted. Ib type diamond, which displays yellow due to nitrogen included as an impurity, is synthesized up to 1 cm diameter by high temperature-high pressure method and sold, but, that size is regarded as an upper limit. Moreover, IIa type diamond, which is colorless and clear, is limited to more smaller size of under several millimeter diameter except for natural products.

Chemical vapor deposition is an established method for diamond synthesis as well as high pressure method. A comparatively large area of several to ten centimeter is architecturally produced by this method and usually it is polycrystalline film. But, single crystalline diamond is necessary to use for diamond applications such as high precision tools, optical components and semiconductors, because especially smooth surface is needed among diamond uses. Accordingly, a method to obtain single crystalline diamond epitaxially grown by chemical vapor deposition has been studied.

Epitaxial growth is generally classified into two, one is homoepitaxial growth to raise the growing substance on a substrate of the same component, and heteroepitaxial growth to grow on a substrate of a different component. Heteroepitaxial growth of cubic boron nitride (cBN), silicon carbide, silicon, nickel, cobalt or the like has been reported (see Japanese Patent Publication Nos. S63-224225, H2-233591 and H4-132687). However, single crystal having good film quality has not obtained by heteroepitaxial growth, then heteroepitaxial growth is regarded as a predominant for single crystal synthesis. With homoepitaxial growth, IIa single crystalline diamond which is larger than the IIa diamond obtained under high pressure is obtained by epitaxially growing high purity diamond from gas phase on a Ib diamond produced by high pressure synthesis. It was reported that, by using a plurality of diamond substrates whose crystal orientations were the same or diamond particles, diamond having only a small inclined grain boundary was obtained by growing unified diamond thereon (see Japanese Patent Publication No. H3-75298).

DISCLOSURE OF THE INVENTION

When single crystalline diamond produced by those methods is utilized as a substrate for semiconductor devices, a large area, little distortion and low cost are required. In addition, when the diamond is utilized as optical components such as an optical window, especially as optical components suitable for shorter wavelength region, it is required that the absorbance of shorter wavelength, specifically wavelength up to 225 nm, which is the absorbance end of diamond, is small. Meanwhile, if single crystalline diamond is produced by chemical vapor deposition, hydrogen contamination in the diamond is unavoidable because the processing gas includes large excess hydrogen. This has been considered a cause of deterioration for optical and electrical characteristics of diamond.

The inventors, as a result of fine study, revealed the fact: in an estimation method utilizing birefringent light, if the retardation of two linear polarized lights perpendicular to each other after transmitting through the sample falls within a certain range, it doesn't significantly damage the characteristics for semiconductor substrates and optical components.

The first aspect of the present invention provides:
a single crystalline diamond produced by chemical vapor deposition, wherein,
when a linear polarized light which is composed of two linear polarized lights perpendicular to each other is introduced into one main face of the single crystalline diamond, a maximum value of a retardation between the two linear polarized lights perpendicular to each other which come out from an opposite main face is not more than 50 μm per a crystal thickness of 100 μm across an entire of the single crystalline diamond.

In order to improve various characteristics for semiconductor substrates or optical components, the inventors had continued fine research from many aspects but in view of crystal distortion. As a result, the inventors found that if retardation caused by transmitting linear polarized lights perpendicular to each other though the sample falls within a certain range in an estimation method utilizing birefringent light, this importantly contributes to maintaining well the various characteristics for semiconductor substrates or optical components.

If the crystal does not have any distortion and is completely optically symmetric, the retardation shows zero. However, most of actual crystals have distortion more or less. The crystal distortion in a transparent crystal is quantitatively analyzed by evaluating the retardation. The inventors discovered that if the maximum of retardation per 100 μm thickness satisfies not more than 50 nm across the entire of sample, which serves as a substrate for semiconductor devices, the most of characteristics as semiconductor are utilized. Meanwhile, the requirement for distortion tends to be severe in an industrial use with short wavelength (ultraviolet). If the maximum of retardation is not more than 10 nm, the crystal is capable of applying to optical lenses or mirrors, etc. If the retardation is not more than 5 nm, more preferably not more than 3 nm, the crystal is applicable for optical components used with short wavelength, such as lenses for ultraviolet light.

Raman spectrometry has been used to quantify the stress in a crystal having distortion. Raman shift is caused by natural frequency of the crystal lattice, therefore, the region where the shift slightly moves from the proper shift of diamond indicates a distorted state that the crystal lattice has narrowed or expanded than usual. The inventors measured the distribution of Raman shifts across the entire crystal surface after single crystal growth. The result revealed that when the distribution falls within the range of ±0.1 μm$^{-1}$ from 1332 cm$^{-1}$, which is standard Raman shift of diamond without distortion, the single crystalline diamond can be used as a substrate especially for optical components. In addition, the full width at half maximum of Raman shift peak of proper diamond preferably shows not more than 2 cm$^{-1}$ across the entire of the crystal.

As a result of research for the relationship between the distortion and the locking curve of X-ray diffractometry on (400) plane, when the full width at half maximum of the curve is not more than 20 arcsec, the single crystalline diamond can be employed as a substrate for optical components. Impurities in the crystal will cause distortion because the atomic radius is different from carbon. When nitrogen impurity, which gives most damage to diamond, is restricted in the range of 0.01 to 5 ppm, the above-mentioned retardation or Raman shift is achieved.

When the invention is used as a substrate for semiconductor devices or a material for optical components, the thickness is preferably not less than 100 μm and not more than 1500 μm. Although the larger diameter is desirable, the size of not less than 4 mm is enough for the processing for devices or optical components. Particularly, in the case of using it as optical components for ultraviolet light, the crystal has a transmittance of not less than 30% at the wavelength of 250 nm.

Besides, when such diamond is employed as a substrate for semiconductor use, it is suitable for the diamond to satisfy: a resistivity of not less than $10^{12}$ Ω·cm at room temperature; a spin density evaluated by electron spin resonance of not more than $1 \times 10^{17}/cm^3$ in a g-value range of not less than 2.0020 to less than 2.0028; a concentration of silicon as an impurity of 0.01 ppm to 1000 ppm. Using not a naturally produced single crystalline substrate but a seed crystal grown by chemical vapor deposition or high pressure synthesis as seed substrate and removing the main face by reactive ion etching first and the side face next by reactive ion etching bring more benefit of the distortion reduction.

The diamond substrate as above is manufactured by a producing method of the second aspect of the present invention.

Namely, a method for producing a single crystalline diamond comprising the steps of:

mechanically polishing a main face and a side face of a single crystalline diamond substrate as a seed;

etching the main face and the side face by reactive ion etching;

newly growing a single crystalline diamond layer thereon by chemical vapor deposition; and separating the single crystalline diamond layer newly grown by chemical vapor deposition from the single crystalline diamond substrate as a seed.

There are flaws caused during mechanically polishing or anomalous layers by processing on the surface of seed substrate. Moreover, the side face of substrate is usually formed by cleavage or laser cutting and this side face also includes an anomalous layer by processing. The inventors unveiled the relationship between the anomalous layer by processing and distortion generated later during chemical vapor deposition, then, they concluded that the distortion can be decreased by growing the single crystal after the aforementioned polishing and etching for the main face and the side face.

The side face of the seed single crystalline diamond substrate after mechanically polishing preferably displays an inclination of not less than 82 degree and not more than 98 degree with respect to the main face. When the inclination is of not less than 82 degree and less than 90 degree, which means a side face inclined upwardly, the growing speed toward horizontal direction increases in the single crystal growth then a larger sized single crystal is easy to be produced. In the contrast, when the inclination is of not less than 90 degree and not more than 98 degree, which means a perpendicular side face or a side face inclined downwardly, the growth involves less distortion and the single crystal is more suitable for applications such as precision optical components, even though the growing speed toward horizontal direction decreases.

A surface roughness of the main face and the side face after polishing is preferably not more than 0.1 μm in terms of Rmax and not more than 10 nm in terms of Ra. The surface roughness is easily measured by atomic force microscope. Chipping a corner or the like of the substrate is allowable but a size of the chip is preferably not more than 50 μm. By satisfying these conditions, anomalous growth in the single crystal growing can be prevented and the growth with less distortion is achieved.

The main face of seed substrate used is preferably (100) plane or approximately (100) plane. If the side face of seed substrate has approximately (100) face direction, the growing speed toward horizontal direction increases, then a larger single crystal is easy to obtain.

In order to prevent generating distortion, a seed substrate that doesn't include an anomalous layer by processing is prepared, but the anomalous layer by processing is difficult to remove by mechanical polishing because of its forming process. Various processings are known as non-mechanical processing for diamond and they include reactive ion etching (RIE hereinbelow), microwave plasma etching, ECR plasma etching, ion beam etching or the like. In these non-mechanical processings, it is difficult for the processings other than RIE to control all of conditions such as processing speed on the seed substrate, area of the seed substrate to be processed, surface roughness after processing, generation of a damaged layer at etching etc., at the same time. RIE can remove only the anomalous layer by processing with high speed, evenness and no damage. By growing single crystal by chemical vapor deposition after that, a single crystalline diamond substrate that has no distortion, high quality and large scale can be obtained.

RIE in the present invention may be carried out by any known methods. These are categorized into a method utilizing capacity combination plasma (CCP), in which high frequency power supply is connected to electrode placed oppositely in a vacuum chamber, a method employing induced combination plasma (ICP), in which high frequency power supply is connected to a coil placed with encompassing a vacuum chamber, and a method combining the both. Any of these methods may be used in the present invention.

Gas for etching is preferably a mixture of oxygen and carbon fluoride, a pressure for etching is preferably not less than 1.33 Pa and not more than 13.3 Pa. Using the gas components and the pressure can remove only the processed anomalous layer with high speed and evenness.

The thickness of not less than 0.5 μm and less than 400 μm is enough for the part to be etched of the main face and the side face of seed substrate in the present invention. The etched part is preferably not less than 5 μm and less than 50 μm, and not less than 10 μm and less than 30 μm is more preferably. Thinner etched part contribute to shortening the processing time, which brings a merit of maintaining the surface evenness. The thickness of processed anomalous layer of the seed substrate depends on the kind of polishing or the strength thereof. Most of the thickness is less than 0.5 μm, but exceptionally there is a local area reaching 10 μm depth. The region which grew on the area could deteriorate semiconductor characteristics therein. On the other hand, when the etched depth is thicker, etching process takes more time and the surface roughened by etching is prone to be severe. In this case, crystallinity deterioration due to the roughed surface would be observed in the sequent single crystal growth.

As a method to apply RIE to the side face, the seed substrate can be etched in horizontal direction at the same time of the front face etching, but it is efficient to etch only the side face with the substrate standing because the thickness of etched part can be controlled independently. As for etching of the side face and the main face, the side face is preferably etched earlier. The substrate is placed to be stood, the main face needs to be covered during the side face etching, but, the main face could be damaged when covered. The main face etching of the present invention can remove the damage.

The chemical vapor deposition to grow a diamond single crystal in the present invention includes heat filament CVD, plasma CVD, plasma jet, burning flame and laser CVD, and either of those known methods may be used. The material gas may be a substance including carbon such as hydrocarbons, for example, methane, ethane, propane, methanol, ethanol, ethylene, acetylene and benzene.

As a seed substrate, a substrate produced by chemical vapor deposition is desirable. When using a CVD substrate, the distortion can be prevented comparing to one produced by high pressure synthesis. How to generate a defect, an amount of impurity or a distribution thereof are different between a single crystal by high pressure synthesis and one by chemical vapor deposition, this causes a slight difference of characteristics such as a coefficient of thermal expansion between the two even if they are the same crystal, as a result, a distortion is piled up. If a seed substrate by chemical vapor deposition is employed, the single crystal to be newly grown will not involve distortion even though the seed substrate includes the aforementioned distortion.

The producing method preferably includes a step of separating the single crystalline layer grown newly from the seed substrate by slicing by means of laser beam with a wavelength of not more than 360 nm. Thereby, process loss can be prevented comparing to the method of shaving off the seed substrate by grinding or the like and the method of slicing by a laser with a wavelength of more than 360 nm, therefore, that process remarkably contributes to low cost.

The technical merits of the present invention are summarized: the contamination of hydrogen causes a problem in chemical vapor deposition as mentioned above, however, by applying the growing method according to the present invention, a diamond single crystal which has enough properties for optical or semiconductor device use can be obtained.

BEST MODE FOR CARRYING OUT THE INVENTION

Now the present invention will be described through Examples and Comparative Examples.

Since the results of sample estimation in Examples and Comparative Examples will be displayed subsequent Tables, estimation items in the tables are explained first.

1) Retardation

The retardation was measured by the method of de Senarmont. Specifically, oval polarized light after transmitted through the sample was transformed into linear polarized light by combination of a quarter wavelength plate and a polarizer, then the retardation was measured. Light source for the measurement was a sodium lamp (wavelength of 589 nm). The retardation obtained was converted into a value per sample thickness of 100 μm, and estimated. The measurement was performed with polarization microscope such that the sample was observed across the entire and the maximum value thereof was determined. The resolution for position was not less than 100 μm.

2) XRC

XRC means a full width at half maximum (arcsec) of a locking curve of X-ray diffractometry. XRC in the present invention was evaluated by two-crystal method using CuKα1 X-ray, and the first crystal of a single crystalline diamond by high pressure synthesis with (400) planes positioned in parallel.

3) Nitrogen Impurity Concentration

The concentration of nitrogen impurity was evaluated by SIMS (Secondary Ion Mass Spectrometry) analysis. In SIMS analysis, a concentration where the outermost surface of the sample was sputtered to 0.5 μm was determined with the conditions: $Cs^+$ was used as the first ion; an acceleration voltage was 15 kV; and an area detected was 35 μm diameter. The concentration was quantitatively analyzed by comparing to a standard sample separately prepared, which was a single crystalline diamond including an impurity at a known concentration produced by ion-implantation.

4) Transmittance

The transmittance at a wavelength of 250 nm was measured.

5) Raman Spectroscopy

The sample was evaluated by micro-Raman spectroscopy with an excitation light of wavelength 514.5 nm from argon ion laser. The maximum value of full widths at half maximum of the Raman scattering spectrum across the crystal, which appears with a shift near 1332 $cm^{-1}$ from the excitation light, was obtained, and, in-plane distribution of the shift differences from a standard crystal without distortion. These were evaluated by use of a spectroscope with a resolution of 0.2 $cm^{-1}$ and the full width at half maximum of the argon laser beam was 1.5 $cm^{-1}$.

EXAMPLE

A Ib single crystal by high pressure synthesis with a size of 4.0×4.0×4.0 mm was used as a seed substrate, and homoepitaxial growth was carried out by chemical vapor deposition according to the following procedure. At first, the substrate, which was a seed for growth, was prepared by the following method. The main face and side face of the seed substrate had (100) face direction and all of the faces were mechanically polished. Six samples were prepared such that the angle of side face with respect to the main face was changed for each substrate. The surface roughnesses of the main face and the side face after polishing were Rmax=0.1 μm and Ra=2.5 nm for both. A part of the substrate side chipped during polishing but the size was not more than 1 μm.

Next, the side face of seed substrate was etched by use of a known RIE apparatus, then, the main face was etched. The amount etched was changed for each substrate by adjusting time. The conditions for etching are as following:

High frequency: 13.56 MHz
Power of high frequency: 280 W
Pressure in chamber: 7 Pa
Flow rate of $O_2$ gas: 4 sccm
Flow rate of $CF_4$ gas: 10 sccm
Etching time: changed for each substrate A single crystal was grown by chemical vapor deposition on the seed substrates obtained as above. The apparatus for growth was a known microwave plasma CVD apparatus. The conditions for growth were: a microwave power of 5 kW, a methane concentration with respect to hydrogen of 12%, a pressure of 1.33×10⁴ Pa, and a substrate temperature of 950° C. Time for growth was 100 hours.

For the samples obtained as above, the CVD single crystal was separated from the seed substrate by third harmonic of YAG laser (wavelength of 355 nm). Both the grown side and the substrate side of the CVD single crystalline layer were polished to mirror finish. The samples after polishing were examined according to the above described estimation items. The results are shown in Table 1. Thereafter, a part horizontally grown from the seed substrate (outer periphery of 4×4 mm shape) was cut off with the aforementioned YAG laser. The squared crystal was examined again for XRC, Raman spectroscopy and retardation among the above estimation items. The results are shown in Table 2.

TABLE 1

| | Sample | | | | | |
|---|---|---|---|---|---|---|
| | A | B | C | D | E | F |
| Angle between the main face and the side face (degree) | 90 | 86 | 94 | 81 | 99 | 90 |
| Etched amount of the main face and the side face (μm) | 5 | 5 | 5 | 5 | 5 | 0.4 |
| Size after growth (mm square) | 4.7 | 5.0 | 4.5 | 5.1 | 4.0 | 4.7 |
| XRC (arcsec) | 25 | 38 | 9 | 110 | 98 | 54 |
| Retardation per 100 μm thickness (nm) | 5 | 47 | 1 | 230 | 110 | 70 |
| Full width at half maximum of Raman spectrum (cm$^{-1}$) | 1.9 | 2.1 | 1.7 | 2.5 | 2.3 | 2.2 |
| Difference from Raman standard (cm$^{-1}$) | −0.04 to +0.06 | −0.12 to 0.11 | −0.02 to +0.02 | −0.36 to +0.48 | −0.22 to +0.39 | −0.15 to +0.20 |
| Nitrogen impurity (ppm) | 0.1 | 0.3 | 0.05 | 5 | 4 | 3 |
| Transmittance (%) | 60 | 58 | 65 | 25 | 30 | 45 |

TABLE 2

| | Sample | | | | | |
|---|---|---|---|---|---|---|
| | A | B | C | D | E | F |
| XRC (arcsec) | 15 | 20 | 8 | 92 | 77 | 43 |
| Retardation (nm) | 3 | 10 | 1 | 150 | 98 | 63 |
| Full width at half maximum of Raman spectrum (cm$^{-1}$) | 1.8 | 1.9 | 1.7 | 2.4 | 2.2 | 2.1 |
| Difference from Raman standard (cm$^{-1}$) | −0.04 to +0.05 | −0.09 to +0.09 | −0.02 to +0.02 | −0.28 to +0.36 | −0.18 to +0.37 | −0.13 to +0.18 |

Sample A was Example of the case that the side face of seed substrate was polished perpendicularly to the main face. The single crystal including the horizontally grown region after removing the seed substrate exhibited a good value of the maximum retardation 5 nm. Furthermore, after removing the horizontally grown region, the maximum retardation was improved to 3 nm, which revealed that the inner crystal was less distorted.

Samples B to E demonstrate comparison by changing the angle between the main face and the side face. About sample B, the angle between the main face and the side of the seed substrate was 86 degree, the growing speed toward horizontal direction of the CVD single crystal obtained was faster than sample A, but the retardation degenerated comparing to sample A. However, by cutting off the horizontally grown region, the maximum retardation inside the crystal was reduced to 10 nm. As for sample C, the angle between the main face and the side face of the seed substrate was 94 degree, and the retardation of the CVD single crystal obtained displayed the minimum value, 1 nm. These samples A to C are capable of applying to semiconductor substrates, and particularly substrate C exhibited good performance as an optical component for ultraviolet light.

Samples D and E were Comparative Examples in which the angle between the main face and the side face was larger. In both, the crystallinity in horizontal growing region deteriorated and the retardation increased, because the face direction of side face significantly differed from (100). Sample F was Comparative Example in which the etched amount on the main face and the side face was decreased. Since etching was insufficient then the crystallinity of single crystal layer worsened during chemical vapor deposition thereafter, the retardation turned larger.

Accordingly, it was found that the diamond of the present invention was a large scaled and high quality single crystalline diamond which had not been obtained so far.

INDUSTRIAL APPLICABILITY

As described above, by the diamond and the producing method of the present invention, a large scaled and high quality single crystalline diamond which had not been obtained until now can be manufactured, and, the present invention opens the way for substrates of semiconductor devices or optical component applications with ultraviolet light.

The invention claimed is:

1. A single crystalline diamond produced by chemical vapor deposition, wherein,
  when a linear polarized light which is composed of two linear polarized lights perpendicular to each other is introduced into one main face of the single crystalline diamond, a maximum value of a retardation between the two linear polarized lights perpendicular to each other which come out from an opposite main face is not more than 50 nm per a crystal thickness of 100 μm across an entire of the single crystalline diamond.

2. A single crystalline diamond according to claim 1, wherein the retardation is not more than 10 nm.

3. A single crystalline diamond according to claim 1, wherein a Raman shift of diamond which is obtained by Raman spectroscopy for a surface of the single crystalline diamond is within a range of 1332 cm$^{-1}$ ±0.1 cm$^{-1}$ across an entire surface of the single crystalline diamond.

4. A single crystalline diamond according to claim 1, wherein a full width at half maximum of a peak of the Raman shift of proper diamond is not more than 2 cm$^{-1}$ across an entire of the single crystalline diamond.

5. A single crystalline diamond according to claim 1, wherein a full width at half maximum of a locking curve of X-ray diffractometry on (400) plane is not more than 20 arcsec across an entire of the single crystalline diamond.

6. A single crystalline diamond according to claim 1, wherein a diameter of the single crystalline diamond is not less than 4 mm.

7. A single crystalline diamond according to claim 1, wherein the single crystalline diamond includes nitrogen as an impurity, a concentration of which is 0.1 to 5 ppm.

8. A single crystalline diamond according to claim 1, wherein a transmittance at a wavelength of 250 nm is not less than 30%.

* * * * *

UNITED STATES PATENT AND TRADEMARK OFFICE
CERTIFICATE OF CORRECTION

| | | |
|---|---|---|
| PATENT NO. | : 7,655,208 B2 | Page 1 of 1 |
| APPLICATION NO. | : 11/402062 | |
| DATED | : February 2, 2010 | |
| INVENTOR(S) | : Meguro et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 820 days.

Signed and Sealed this

Twenty-third Day of November, 2010

David J. Kappos
*Director of the United States Patent and Trademark Office*